United States Patent
Kim et al.

(10) Patent No.: US 8,968,983 B2
(45) Date of Patent: Mar. 3, 2015

(54) PHOTORESIST COMPOSITION, METHOD OF FORMING A PATTERN USING THE SAME, AND METHOD OF MANUFACTURING A DISPLAY SUBSTRATE

(75) Inventors: Cha-Dong Kim, Hwaseong-si (KR); Sang Hyun Yun, Suwon-si (KR); Jung-In Park, Seoul (KR); Su-Yeon Sim, Changwon-si (KR); Hi-Kuk Lee, Yongin-si (KR); Sang-Tae Kim, Iksan-si (KR); Yong-Il Kim, Iksan-si (KR); Shi-Jin Sung, Iksan-si (KR); Eun-Sang Lee, Iksan-si (KR); Sung-Yeol Jin, Iksan-si (KR)

(73) Assignee: Samsung Display Co., Ltd., Yongin (KR)

( * ) Notice: Subject to any disclaimer, the term of this patent is extended or adjusted under 35 U.S.C. 154(b) by 413 days.

(21) Appl. No.: 13/565,589

(22) Filed: Aug. 2, 2012

(65) Prior Publication Data

US 2013/0040410 A1    Feb. 14, 2013

(30) Foreign Application Priority Data

Aug. 11, 2011   (KR) ...................... 10-2011-00980170

(51) Int. Cl.
*G03F 7/022*   (2006.01)
*G03F 7/023*   (2006.01)
*G03F 7/40*    (2006.01)

(52) U.S. Cl.
CPC .............. *G03F 7/0226* (2013.01); *G03F 7/023* (2013.01); *G03F 7/40* (2013.01)
USPC ...................... 430/270.1; 430/281.1; 438/149; 438/151; 428/1.2; 257/59

(58) Field of Classification Search
USPC .................... 430/270.1, 281.1; 438/149, 151; 257/59, 72; 428/1.1, 1.2
See application file for complete search history.

(56) References Cited

U.S. PATENT DOCUMENTS 7,291,439 B2 * 11/2007 Park et al. ............... 430/191
8,470,503 B2 *  6/2013 Hsu et al. ................ 430/7

* cited by examiner

*Primary Examiner* — David Vu
(74) *Attorney, Agent, or Firm* — H.C. Park & Associates, PLC

(57) ABSTRACT

A photoresist composition, a method of forming a pattern using the photoresist composition, and a method of manufacturing a display substrate are disclosed. A photoresist composition includes an alkali-soluble resin, a quinone diazide-based compound, a multivalent phenol-based compound, and a solvent. Therefore, photosensitivity for light having a wavelength in a range of about 392 nm to about 417 nm may be improved, and reliability of forming a photo pattern and a thin film pattern using the photoresist composition may be improved.

22 Claims, 6 Drawing Sheets

PHOTORESIST COMPOSITION, METHOD OF FORMING A PATTERN USING THE SAME, AND METHOD OF MANUFACTURING A DISPLAY SUBSTRATE

CROSS REFERENCE TO RELATED APPLICATION

This application claims priority from and the benefit of Korean Patent Application No. 10-2011-0080170, filed on Aug. 11, 2011, which is herein incorporated by reference for all purposes as if fully set forth herein.

BACKGROUND OF THE INVENTION

1. Field of the Invention

Exemplary embodiments of the present invention relate to a photoresist composition, a method of forming a pattern using the photoresist composition, and a method of manufacturing a display substrate. Particularly, exemplary embodiments of the present invention relate to a photoresist composition for a digital exposure device, a method of forming a pattern using the photoresist composition, and a method of manufacturing a display substrate.

2. Discussion of the Background

Generally, a display substrate including a thin-film transistor ("TFT") is formed by a photolithography process. The photolithography process includes an exposure step, a developing step and an etching step. In the exposure step, a photoresist pattern is formed using a mask reflecting a design of a pattern and an exposure device (hereinafter, general exposure device). A lower layer of the photoresist pattern is patterned using the photoresist pattern as an etch stopping layer to form the pattern. Whenever the design of the metal pattern is changed, the design of the mask needs to be changed so that the number of the masks depends on the number of the metal patterns. Due to the high cost of manufacturing the mask, increasing the number of masks used for the photolithography process increases the manufacturing cost for the display substrate. Recently, in order to solve the above-mentioned problem, a digital exposure device has been used. The digital exposure device uses an optical element including a plurality of micro-mirrors capable of providing a plurality of spot beams onto a substrate without using an additional mask.

However, the digital exposure device uses a light source generating a light having a wavelength different from the general exposure device. Thus, when a photoresist composition appropriate for the general exposure device is used for the digital exposure device in the photolithography process, photosensitivity may be decreased so that the residue rate may be increased and the linearity of a photo pattern formed using the photoresist composition may be decreased. In addition, since the digital exposure device uses the spot beams, an exposure region may not receive a uniform light from the digital exposure device. Thus, the reliability of the photo pattern and a pattern formed using the photo pattern may be reduced.

SUMMARY OF THE INVENTION

Exemplary embodiments of the present invention provide a photoresist composition capable of improving photosensitivity, thermal resistance and profile reliability without decreasing residue rate and resolution. Therefore, photo properties of the photoresist composition for a digital exposure device may be improved so that manufacturing a pattern and a display substrate may be improved.

Additional features of the invention will be set forth in the description which follows and, in part, will be apparent from the description or may be learned by practice of the invention.

An exemplary embodiment of the present invention discloses a photoresist composition comprising an alkali-soluble resin; a quinone diazide-based compound; a multivalent phenol-based compound represented by Chemical Formula 1; and a solvent.

Chemical Formula 1 is represented by the following:

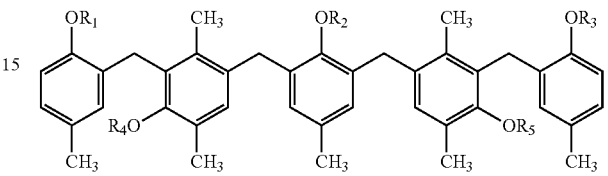

wherein $R_1$, $R_2$, $R_3$, $R_4$ and $R_5$ independently represent a hydrogen atom or a functional group represented by Chemical Formula 2.

Chemical Formula 2 is represented by the following:

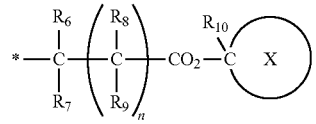

wherein $R_6$, $R_7$, $R_8$ and $R_9$ independently represent a hydrogen atom or an alkyl group having 1 to 4 carbon atoms, "n" represents an integer of 0 to 3, $R_{10}$ represents an alkyl group having 1 to 6 carbon atoms or a cyclo-alkyl group having 3 to 12 carbon atoms, and a ring X represents a cycloaliphatic hydrocarbon group having 3 to 20 carbon atoms.

An exemplary embodiment of the present invention also discloses a method of forming a pattern comprising: forming a film on a substrate; forming a photoresist layer using a photoresist composition on the film, the photoresist composition comprising an alkali-soluble resin, a quinone diazide-based compound, a multivalent phenol-based compound represented by Chemical Formula 1, and a solvent; forming a photo pattern using the photoresist layer; and etching the film using the photo pattern as an etch stopping layer to form a film pattern.

Chemical Formula 1 is represented by the following:

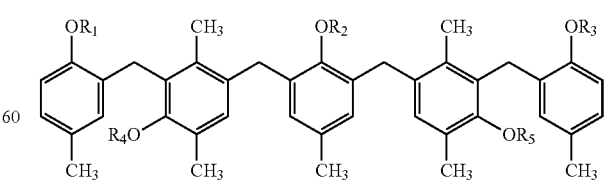

wherein $R_1$, $R_2$, $R_3$, $R_4$ and $R_5$ independently represent a hydrogen atom or a functional group represented by Chemical Formula 2.

Chemical Formula 2 is represented by the following:

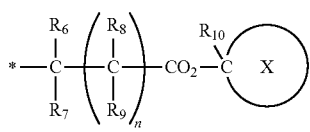

wherein $R_6$, $R_7$, $R_8$ and $R_9$ independently represent a hydrogen atom or an alkyl group having 1 to 4 carbon atoms, "n" represents an integer of 0 to 3, $R_{10}$ represents an alkyl group having 1 to 6 carbon atoms or a cyclo-alkyl group having 3 to 12 carbon atoms, and a ring X represents a cycloaliphatic hydrocarbon group having 3 to 20 carbon atoms.

An exemplary embodiment of the present invention additionally discloses a method of manufacturing a display substrate comprising forming a metal layer on a substrate; forming a photo pattern on the metal layer using a photoresist composition comprising an alkali-soluble resin, a quinone diazide-based compound, a multivalent phenol-based compound represented by Chemical Formula 1, and a solvent; etching the metal layer using the photo pattern as an etch stopping layer to form a signal line and an electrode of a switching element connected to the signal line; and forming a pixel electrode connected to the switching element.

Chemical Formula 1 is represented by the following:

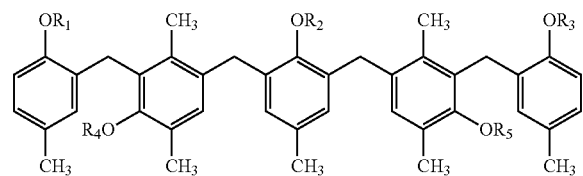

wherein $R_1$, $R_2$, $R_3$, $R_4$ and $R_5$ independently represent a hydrogen atom or a functional group represented by Chemical Formula 2.

Chemical Formula 2 is represented by the following:

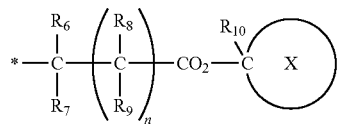

wherein $R_6$, $R_7$, $R_8$ and $R_9$ independently represent a hydrogen atom or an alkyl group having 1 to 4 carbon atoms, "n" represents an integer of 0 to 3, $R_{10}$ represents an alkyl group having 1 to 6 carbon atoms or a cyclo-alkyl group having 3 to 12 carbon atoms, and a ring X represents a cycloaliphatic hydrocarbon group having 3 to 20 carbon atoms.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and, together with the description, serve to explain the principles of the invention.

DETAILED DESCRIPTION OF THE ILLUSTRATED EMBODIMENTS

Figure 1:
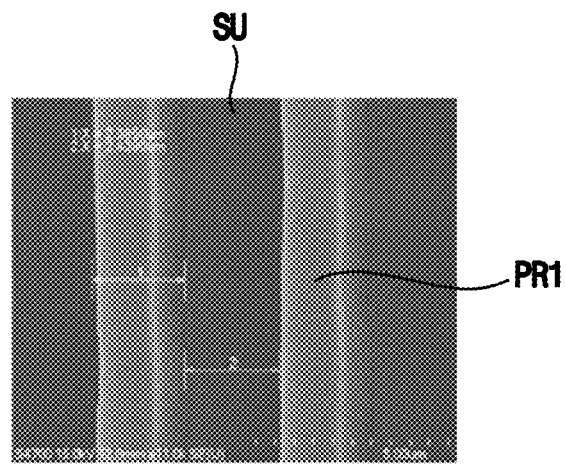
FIG. 1 is a plan view illustrating a photo pattern formed using a photoresist composition according to Example 1.

Advantages and features of the present invention and methods of accomplishing the same may be understood more readily by reference to the following detailed description of exemplary embodiments and the accompanying drawings. The present invention may, however, be embodied in many different forms and should not be construed as being limited to the exemplary embodiments set forth herein. Rather, these exemplary embodiments are provided so that this disclosure will be thorough and complete and will convey concepts of the invention to those skilled in the art. In the drawings, sizes and relative sizes of layers and regions may be exaggerated for clarity.

The invention is described more fully hereinafter with reference to the accompanying drawings in which exemplary embodiments of the invention are shown. This invention may, however, be embodied in many different forms and should not be construed as limited to the exemplary embodiments set forth herein. Rather, these exemplary embodiments are provided so that this disclosure is thorough and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on," "connected to," or "coupled to" another element or layer, it can be directly on, directly connected to, directly coupled to the other element or layer, or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. Throughout the specification, like reference numerals in the drawings denote like elements.

Exemplary embodiments of the present invention are described herein with reference to cross-sectional illustrations that are schematic illustrations of idealized exemplary embodiments of the present invention. As such, variations from the shapes of the illustrations as a result, for example, of manufacturing techniques and/or tolerances, are to be expected. Thus, exemplary embodiments of the present invention should not be construed as limited to the particular shapes of regions illustrated herein but are to include deviations in shapes that result, for example, from manufacturing. Thus, the regions shown in the figures are schematic in nature, and their shapes are not intended to illustrate the precise shape of a region and are not intended to limit the scope of the present invention.

Unless otherwise defined, all terms (including technical and scientific terms) used herein have a meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a photoresist composition according to an exemplary embodiment of the present invention is described with reference to the accompanying drawings.

Photoresist Composition

The photoresist composition according to an exemplary embodiment of the present invention includes an alkali-soluble resin, a quinone diazide-based compound, a multivalent phenol-based compound, and a solvent. The photoresist compound may further include an additive, which may include at least one of 1,4-cyclohexanediol and 1,4-cyclohexanedimethanol.

The alkali-soluble resin itself is soluble in an alkaline solution, and the alkali-soluble resin reacted with the quinone diazide-based compound is insoluble in the alkaline solution. A kind of alkali-soluble resin is not limited, and the known materials in this technical field may be used as the alkali-soluble resin.

For example, a novolac resin may be used as the alkali-soluble resin. The novolac resin may be formed by condensation with a phenol compound and an aldehyde compound. Examples of the phenol compound may include phenol, ortho-cresol, meta-cresol, para-cresol, 2,5-xylenol, 3,5-xylenol, 3,4-xylenol, 2,3,4-trimethylphenol, 4-t-butylphenol, 2-t-butylphenol, 3-t-butylphenol, 3-ethylphenol, 2-ethylphenol, 4-ethylphenol, 3-methyl-6-t-butylphenol, 4-methyl-2-t-butylphenol, 2-naphthol, 1,3-dihydroxynaphthalene, 1,7-dihydroxynaphthalene, 1,5-dihydroxynaphthalene, etc. These compounds may be used alone or in a combination thereof. Examples of the aldehyde compound may include formaldehyde, para-formaldehyde, acetaldehyde, propylaldehyde, benzaldehyde, phenylaldehyde, alpha-phenylpropylaldehyde, beta-phenylpropylaldehyde, ortho-hydroxybenzaldehyde, meta-hydroxybenzaldehyde, para-hydroxybenzaldehyde, glutaraldehyde, glyoxal, ortho-methylbenzaldehyde, para-methylbenzaldehyde, etc. These compounds may be used alone or in a combination thereof. For example, a cresol novolac resin formed by condensation of m-cresol and p-cresol with formaldehyde may be used in an exemplary embodiment of the present invention.

An addition-condensation reaction of the phenol compound with the aldehyde compound may be performed in the presence of an acid catalyst via a conventional process for obtaining a novolac resin. For example, the addition-condensation reaction may be performed at a temperature of in a range of about 60° C. to about 250° C. for about 2 hours to about 30 hours. Examples of the acid catalyst may include an organic acid such as oxalic acid, formic acid, trichloroacetic acid, para-toluenesulfonic acid, etc.; an inorganic acid such as hydrochloric acid, sulfuric acid, perchloric acid, phosphoric acid, etc.; and a bivalence metal salt such as acetic acid zinc salt, acetic acid magnesium salt, etc. These catalysts may be used alone or in a combination thereof. The addition-condensation reaction may be performed in a solvent or a bulk.

When the average molecular weight of the alkali-soluble resin, based on a polystyrene-reduced average molecular weight, is in a range of about 2,000 to about 50,000, photosensitivity may be increased in a range in which a developing margin, residue rate, and thermal resistance are not decreased. In addition, damage to a photo pattern formed by the photoresist composition may be reduced. Therefore, the average molecular weight of the alkali-soluble resin may be in a range of about 2,000 to about 50,000.

When the amount of the alkali-soluble resin is in a range of about 10% by weight to about 25% by weight based on a total weight of the photoresist composition, the developing margin, the residue rate, and the thermal resistance may be increased. Thus, the amount of the alkali-soluble resin may be in a range of about 10% by weight to about 25% by weight.

The quinone diazide-based compound has photosensitivity. When light is not provided to the quinone diazide-based compound, the quinone diazide-based compound itself reacts with the alkali-soluble resin to cross-link the alkali-soluble resin so that the alkali-soluble resin may be insoluble. When the quinone diazide-based compound receives light, the quinone diazide-based compound decomposes so that the quinone diazide-based compound does not react with the alkali-soluble resin and is dissolved in the alkaline solution. A kind of the quinone diazide-based compound is not limited and the known materials in this technical field may be used as the quinone diazide-based compound. Examples of the quinone diazide-based compound may include naphthoquinone-1,2-diazide-5-sulfonylchloride, naphthoquinone-1,2-diazide-4-sulfonylchloride, etc. The quinone diazide-based compound may further include a functional group capable of a condensation with the alkali-soluble resin except for the above quinone diazide-based compound. Examples of the functional group may include phenol, paramethoxyphenol, hydroxyphenone, 2,3,4,4'-tetrahydroxybenzophenone, 2,4-dihydroxybenzophenone, aniline, etc. Particularly, a hydroxyl based compound may be used as the quinone diazide-based compound.

When the amount of the quinone diazide-based compound is in a range of about 1% by weight to about 10% by weight based on the total weight of the photoresist composition, the residue rate may be improved and a loss of a photo pattern formed using the photoresist composition may be reduced. In addition, photosensitivity may be maximized and scum formed under the photo pattern may be reduced in the above range of the quinone diazide-based compound. Therefore, the amount of the quinone diazide-based compound may be in a range of about 1% by weight to about 10% by weight.

The multivalent phenol-based compound may improve the photosensitivity of the photoresist composition and the resolution. The multivalent phenol-based compound is represented by Chemical Formula 1.

<Chemical Formula 1>

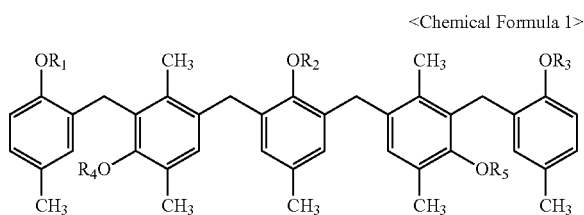

In Chemical Formula 1, $R_1$, $R_2$, $R_3$, $R_4$ and $R_5$ independently represent a hydrogen atom or one of a functional group represented by Chemical Formula 2.

<Chemical Formula 2>

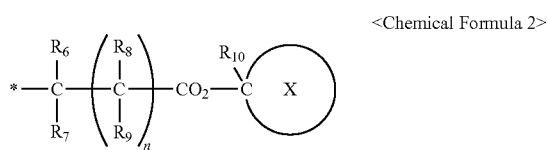

In Chemical Formula 2, $R_6$, $R_7$, $R_8$ and $R_9$ independently represent a hydrogen atom or an alkyl group having 1 to 4 carbon atoms, and "n" represents an integer of 0 to 3. $R_{10}$ represents an alkyl group having 1 to 6 carbon atoms or a cyclo-alkyl group having 3 to 12 carbon atoms. When $R_{10}$ represents the alkyl group, examples of the alkyl group may include methyl, ethyl, n-propyl, iso-propyl, n-butyl, iso-butyl, sec-butyl, tert-butyl, n-pentyl, tert-pentyl, n-hexyl, etc. When $R_{10}$ represents the cyclo-alkyl group, examples of the cyclo-alkyl group may include cyclopropyl, cyclobutyl, cyclopentyl, cyclohexyl, cycloheptyl, cyclooctyl, etc.

A ring X in Chemical Formula 2 represents a cycloaliphatic hydrocarbon group having 3 to 20 carbon atoms. The cycloaliphatic hydrocarbon group may include monocycle, bicycles or multiple cycles greater than the bicycle, etc. In an exemplary embodiment, the Ring X may be the cycloaliphatic hydrocarbon group of the multiple cycles.

In Chemical Formula 2, one of two combining lines combined with the Ring X represents a bond extended from —$CO_2$— adjacent to the Ring X and the other represents a bond extended from the group $R_{10}$ adjacent to the Ring X. In an embodiment, when the Ring X has three carbon atoms in Chemical Formula 2, the functional group represented by Chemical Formula 2 includes a functional group represented by Chemical Formula 3.

<Chemical Formula 3>

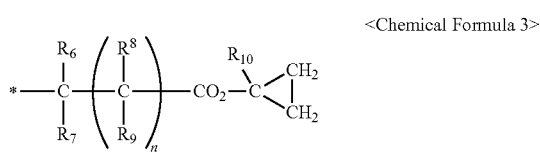

In an embodiment, when the Ring X has seven carbon atoms in Chemical Formula 2, the functional group represented by Chemical Formula 2 includes a functional group represented by Chemical Formula 4.

<Chemical Formula 4>

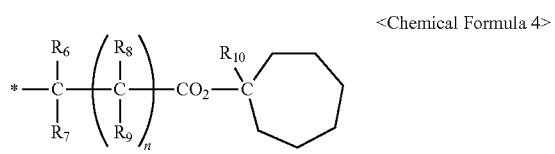

In an embodiment, $R_6$ and $R_7$ independently represent a hydrogen atom and "n" represents 0 in Chemical Formula 2.

When the average molecular weight of the multivalent phenol-based compound of the photoresist composition according to exemplary embodiments of the present invention is in a range of about 700 to about 5,000, the thermal resistance, the resolution, and the photosensitivity may increase and the photo patterned formed using the photoresist composition may be prevented from having a reverse-tapered shape. Therefore, the average molecular weight of the multivalent phenol-based compound may be in a range of about 700 to about 5,000.

When the amount of the multivalent phenol-based compound is in a range of about 0.5% by weight to about 10% by weight based on the total weight of the photoresist composition, the photosensitivity, and the resolution may be increased. Therefore, the amount of the multivalent phenol-based compound based on the total weight of the photoresist composition may be in a range of about 0.5% by weight to about 10% by weight.

The solvent dissolves the alkali-soluble resin, the quinone diazide-based compound, and the multivalent phenol-based compound so that the photoresist composition may be in a liquid state. A kind of the solvent is not particularly limited. A dry rate of the solvent may be controlled such that the solvent is evaporated after coating the photoresist composition to form uniform and planarized photoresist layer. The solvent occupies a reminder of the photoresist composition excluding the alkali-soluble resin, the quinone diazide-based compound, and the multivalent phenol-based compound. The solvent is added into the alkali-soluble resin, the quinone diazide-based compound and the multivalent phenol-based compound so that the total weight of the photoresist composition becomes about 100% by weight.

Examples of a material that can be used for the solvent include glycol ether esters including ethyl cellosolve acetate, methyl cellosolve acetate, propylene glycol monomethyl ether acetate, propylene glycol monoethyl ether acetate, etc.; glycol ethers including ethyl cellosolve, methyl cellosolve, propylene glycol monomethyl ether, propylene glycol monoethyl ether, etc.; esters including ethyl acetate, butyl acetate, amyl acetate, ethyl pyruvate, etc.; ketones including acetone, methyl isobutyl ketone, 2-heptone, cyclohexanone, etc.; cyclic esters including γ-butyrol acetone, etc. These materials may be used alone or in a combination thereof.

The additive may prevent the photosensitivity of the photoresist composition from being decreased, and may prevent a developing defect. Particularly, the additive may be uniformly dispersed in the photoresist composition to increase the light-transmittance so that the photosensitivity of the photoresist composition may be improved and the developing defect caused at a bottom portion of the photo pattern may be prevented. The amount of the additive may be in a range of about 0.1% by weight to about 10% by weight based on the total weight of the photoresist composition in a range in which functions of the alkali-soluble resin, the quinone diazide-based compound and the multivalent phenol-based compound are not deteriorated. For example, the amount of the additive may be in a range of about 0.5% by weight to about 5% by weight.

In addition, the photoresist composition may further include a surfactant, a plasticizer, a sensitizer, or different resin components from the alkali-soluble resin etc., in a range in which functions of the alkali-soluble resin, the quinone diazide-based compound and the multivalent phenol-based compound are not deteriorated.

Hereinafter, the photoresist composition will be described in detail, referring to Examples according to exemplary embodiments of the present invention and Comparative Examples.

Preparation of Photoresist Composition

Preparation of a First Novolac Resin (A-1)

After providing formalin to a mixture including m-cresol and p-cresol in a weight ratio of about 6:4, a cresol novolac resin was prepared by condensation thereof via a general method using oxalic acid. The cresol novolac resin was separated and cut in a middle molecular region to obtain a first novolac resin including the high and low molecular regions having an average molecular weight of about 15,000.

Preparation of Second Novolac Resin (A-2)

After providing formalin to a mixture including m-cresol and p-cresol in a weight ratio of about 5:5, a cresol novolac resin was prepared by condensation thereof via a general method using oxalic acid. The cresol novolac resin was separated and cut in a middle molecular region to obtain a first novolac resin including the high and low molecular regions having an average molecular weight of about 16,000.

Photoresist compositions according to Example 1 to 3 and Comparative Example 1 were prepared according to Table 1, using the first and second novolac resins prepared by the above methods. Each of the mixtures according to Example 1 to 3 and Comparative Example 1 in Table 1 was filtered using a filter having a size of about 0.2 μm to obtain the photoresist compositions in Table 1.

sented by Chemical Formula 1, "D-1" represents propylene glycol monoether acetate, "D-2" represents propylene glycol monomethyl ether, and "E-1" represents 1,4-cyclohexane dimethanol.

Preparation of Example 1 to 3 and Comparative Example 1

Each of the photoresist compositions according to Example 1 to 3 and Comparative Example 1 was spin-coated on a glass substrate and directly pre-baked on a hot-plate at a temperature of about 105° C. for about 130 seconds, thereby forming a photoresist layer having a thickness of about 1.50 μm. After a glass substrate including the photoresist layer in line regions spaced apart from each other was exposed to light while sequentially changing an amount of light exposure using a digital exposure device including a light source of a h-line type, the photoresist layer is puddle-developed using tetramethyl ammonium hydroxide ("TMAH") having a concentration of about 2.38% for about 70 seconds to form Example 1 to 3 and Comparative Example 1, respectively, including a photo pattern formed on the glass substrate. Example 1 and Comparative Example 1 were observed using a scanning electron microscope ("SEM"), and the obtained results are represented in FIG. 1 to FIG. 4.

Figure 2:
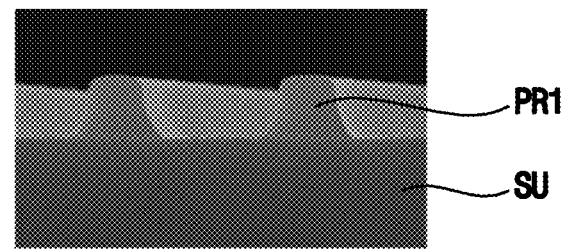
FIG. 2 is a cross-sectional view of the photo pattern in FIG. 1.

FIG. 1 is a plan view illustrating a photo pattern formed using a photoresist composition according to Example 1, and FIG. 2 is a cross-sectional view of the photo pattern in FIG. 1.

Referring to FIG. 1, the photo pattern of Example 1 includes the line patterns PR1 extending in a first direction and spaced apart from each other along a second direction perpendicular to the first direction. The glass substrate SU is partially exposed between the line patterns PR1. In each of the line patterns PR1, a width of the line pattern PR1 along the second direction is entirely uniform. Referring to FIG. 2, a cross-sectional shape of the line pattern PR1 of Example 1 is a trapezoid shape having a decreasing width from a surface of the glass substrate SU to an upper portion of the line pattern PR1.

Figure 3:
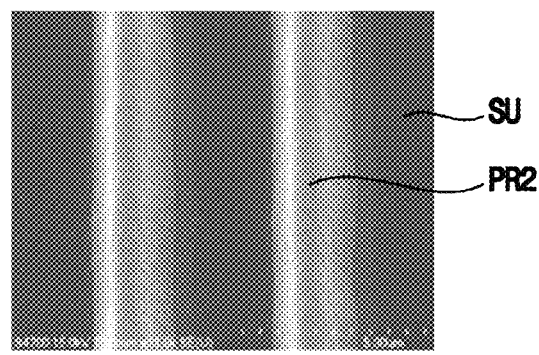
FIG. 3 is a plan view illustrating a photo pattern formed using a photoresist composition according to Comparative Example 1.
Figure 4:
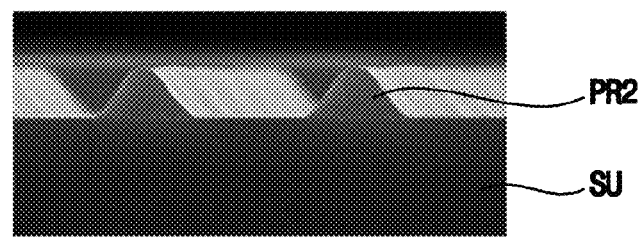
FIG. 4 is a cross-sectional view of the photo pattern in FIG. 3.

FIG. 3 is a plan view illustrating a photo pattern formed using a photoresist composition according to Comparative Example 1, and FIG. 4 is a cross-sectional view of the photo pattern in FIG. 3.

TABLE 1

| division | Alkali-soluble resin | | Quinone diazide-based compound | | Multivalent phenol-based | solvent | | Additive | |
|---|---|---|---|---|---|---|---|---|---|
| | kind | amount (% by weight) | kind | amount (% by weight) | compound (% by weight) | kind | amount (% by weight) | kind | amount (% by weight) |
| Example 1 | A-1/ A-2 | 5.72/ 8.58 | B-1 | 3.5 | 0.75 | D-1/ D-2 | 48.57/ 32.38 | E-1 | 0.5 |
| Example 2 | A-1/ A-2 | 5.72/ 8.58 | B-1 | 3.5 | 1 | D-1/ D-2 | 48.42/ 32.28 | E-1 | 0.5 |
| Example 3 | A-1/ A-2 | 5.72/ 8.58 | B-1 | 3.5 | 1.5 | D-1/ D-2 | 48.12/ 32.08 | E-1 | 0.5 |
| Comparative Example 1 | A-1/ A-2 | 5.72/ 8.58 | B-1 | 3.5 | — | D-1/ D-2 | 49.32/ 32.88 | — | — |

In Table 1, "A-1" represents the first novolac resin, and "A-2" represents the second novolac resin. In addition "B-1" represents a diazide-based photosensitive compound esterifying 2,3,4,4'-tetrahydroxybenzophenone and 1,2-naphthoquinonediazide-5-sulfonylchloride, the multivalent phenol-based compound represents T-493-2 (product name, Sumitomo Corporation, Japan) of the Compounds repre- Referring to FIG. 3, the line patterns PR2 of the photo pattern of Comparative Example 1 uniformly extend in the first direction. However, a cross-sectional shape of the line pattern PR2 of the Comparative Example 1 has a decreasing width from a surface of the glass substrate SU to an upper portion of the photo pattern, and an apex portion of the photo pattern has an acute shape so that the cross-sectional shape of the line pattern PR2 has substantially triangle shape.

When the photo patterns of Example 1 and Comparative Example 1 in FIGS. 1 to 4 are compared to each other, the linearity and the residue rate of the photo pattern of Example 1 are better than those of the photo pattern of Comparative Example 1.

Property Evaluation of the Photo Pattern

The resolution, angle of a pattern, residue rate and thermal resistance were evaluated according to the following method. Obtained results are represented in Table 2. In particular, the thermal resistance was evaluated by comparing a shape of a profile before/after baking at a temperature of about 150° C. for about 150 seconds on the hot-plate through a SEM picture. In the thermal resistance of Table 2, obtained results are represented by "No deformation" of the profile (⊚), "Small deformation" (○), and "Large deformation" ( ). The result "x" represents a collapsed baked profile.

TABLE 2

| | Actual effect sensitivity (mJ) | Resolution (μm) | Residue rate (%) | Angle of pattern (°) | Thermal resistance |
|---|---|---|---|---|---|
| Example 1 | 16 | 2.54 | 95 | 66 | ○ |
| Example 2 | 17 | 2.38 | 94 | 70 | ○ |
| Example 3 | 17 | 2.36 | 95 | 78 | ○ |
| Comparative Example 1 | 27 | 3.11 | 64 | 47 | Δ |

In Table 2, the "resolution" means a minimal width of the line pattern formed when an energy substantially the same as an actual effect sensitivity is provided to expose the photoresist layer. The actual effect sensitivity is defined as an amount of exposing light when a rate between a cross-section area of each of the line patterns and a cross-section area of a space pattern disposed between the line patterns is about 1:1. The "residue rate" is a thickness rate of the photoresist layer before and after developing the photoresist layer, and may be represented by an equation "[(a thickness of the photoresist layer after developing)/(a thickness of the photoresist layer before developing)×100]." The "angle of the pattern" represents an acute angle between a surface of the glass substrate and a side surface of the photo pattern in the SEM pictures.

Referring to Table 2, the resolution, the residue rate and the thermal resistance of Examples 1 to 3 formed using the photoresist composition of exemplary embodiments of the present invention and light having a wavelength of the h-line range are excellent, compared to Comparative Example 1 formed by using the photoresist composition according to Comparative Example 1, which does not include the multivalent phenol-based compound, and using light having the wavelength of the h-line range. That is, the photoresist composition according to exemplary embodiments of the present invention has an excellent photosensitivity for light having the wavelength of the h-line range.

Hereinafter, a method of forming a pattern using the photoresist composition according to an exemplary embodiment of the present invention and a method of manufacturing a display substrate will be described with reference to the accompanying drawings.

Figure 5:
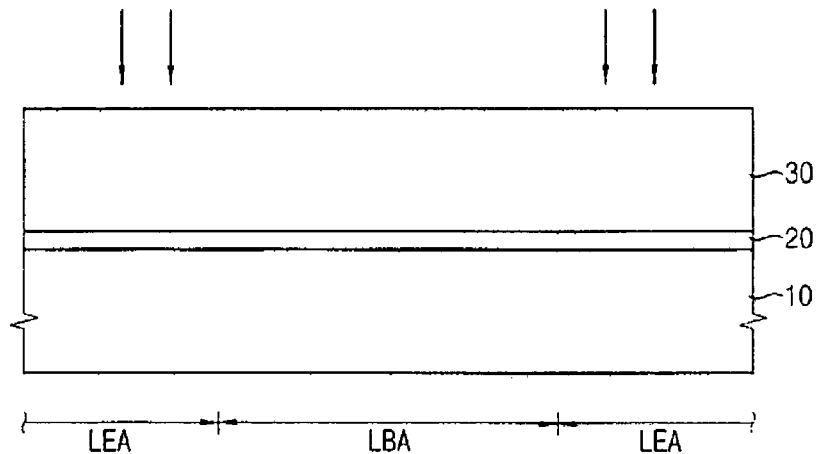
FIG. 5 is a cross-sectional view illustrating an exposure process of a method of forming a pattern according to an exemplary embodiment of the present invention.

FIG. 5 is a cross-sectional view illustrating an exposure process of a method of forming a pattern according to an exemplary embodiment of the present invention.

Referring to FIG. 5, a thin film 20 as an etched object is formed on a base substrate 10, and a photoresist composition is coated on the thin film 20 to form a photoresist layer 30. The photoresist composition includes an alkali-soluble resin, a quinone diazide-based compound, a multivalent phenol-based compound represented by Chemical Formula 1, and a solvent.

<Chemical Formula 1>

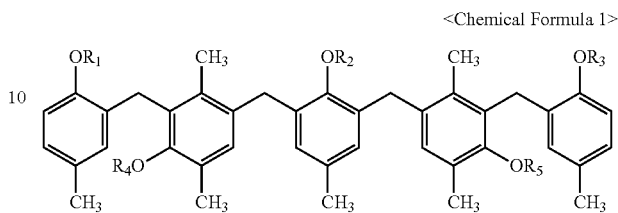

In Chemical Formula 1, $R_1$, $R_2$, $R_3$, $R_4$ and $R_5$ independently represent a hydrogen atom or one of a functional group represented by Chemical Formula 2.

<Chemical Formula 2>

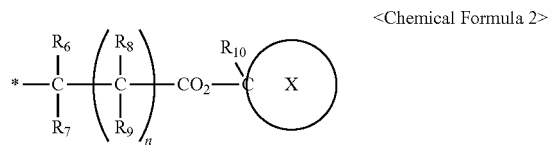

In Chemical Formula 2, $R_6$, $R_7$, $R_8$ and $R_9$ independently represent a hydrogen atom or an alkyl group having 1 to 4 carbon atoms, and "n" represents an integer of 0 to 3. $R_{10}$ represents an alkyl group having 1 to 6 carbon atoms or a cyclo-alkyl group having 3 to 12 carbon atoms. A ring X represents a cycloaliphatic hydrocarbon group having 3 to 20 carbon atoms. The photoresist composition is substantially the same as the photoresist composition illustrated above. Thus, any repetitive descriptions will be omitted. The photoresist composition has a positive type which the photoresist composition itself is soluble in a developing solution and becomes insoluble when exposed to light.

In an embodiment, the photoresist layer 30 may be formed using a dipping method, a spray method, a rotation method or a spin-coating method, etc. The photoresist layer 30 is pre-baked at a temperature in a range of about 100° C. to about 120° C. so that the solvent of the photoresist composition is evaporated and a solid component remains without being decomposed on the base substrate 10.

The base substrate 10 on which the photoresist layer 30 is formed is exposed to light. Light having a wavelength of an h-line range is used on the photoresist layer 30. Particularly, the wavelength of the h-line range may be in a range of about 392 nm to about 417 nm. The photoresist layer 30 is exposed to light using a digital exposure device 400 (see FIG. 6) including a light source which emits light having the wavelength of the h-line range without an additional light-blocking mask. The digital exposure device 400 may selectively determine an exposing region and a light-blocking region. That is, the digital exposure device 400 does not provide the light to a light-blocking region LBA of the base substrate 10 and provides the light to an exposing region LEA of the base substrate 10.

Hereinafter, the digital exposure device 400 and an exposure process using the digital exposure device 400 will be described in detail.

Figure 6:
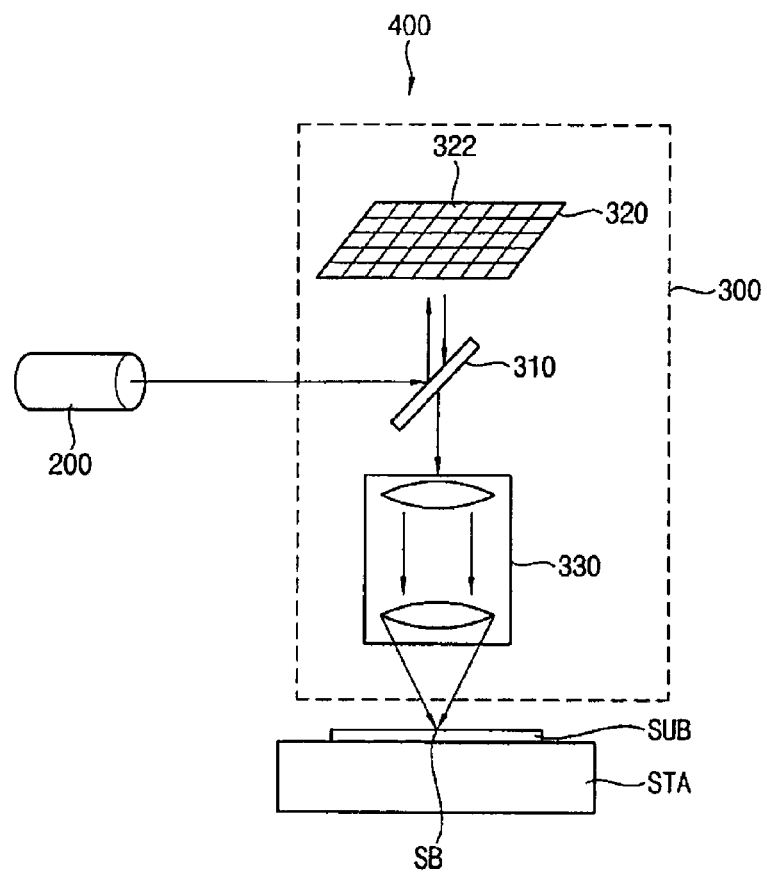
FIG. 6 is a conceptual view illustrating a digital exposure device used in the exposure process in FIG. 5.

FIG. 6 is a conceptual view illustrating a digital exposure device used in the exposure process in FIG. 5.

Referring to FIG. 6, the digital exposure device 400 may include a light source 200 generating a light, an optical head 300 receiving the light from the light source 200 and a stage STA receiving the light from the optical head 300. The base substrate 10 on which the thin film 20 and the photoresist layer 30 are sequentially formed in FIG. 5 is disposed on the stage STA. In FIG. 6, the base substrate 10 on which the thin film 20 and the photoresist layer 30 are formed is represented by a "substrate SUB."

The light source 200 emits a laser beam to the optical head 300. A wavelength of light generated from the light source 200 is included in the h-line range, and the h-line range may be in a range of about 392 nm to about 417 nm.

The optical head 300 includes a beam splitter 310, a digital micro-mirror device ("DMD") 320, and an optical system 330. Particularly, the beam splitter 310 may reflect and transmit the laser beam emitted from the light source 200. The laser beam reflected by the beam splitter 310 is provided to the DMD 320. The beam splitter 310 transmits a light received from the DMD 320 to provide the light to the optical system 330.

The DMD 320 includes a plurality of micro-mirrors 322. The micro-mirrors 322 may be arranged having a matrix shape of m×n. Each of the micro-mirrors 322 may reflect the light received from the beam splitter 310. The DMD 320 may selectively reflect the light received from the beam splitter 310 based on image data forming an image provided onto a substrate SUB disposed on the stage STA. Although not shown in figures, the optical head 300 may further include a mirror controlling part to control each of the micro-mirrors 322 based on the image data. The mirror controlling part may output a signal controlling to turn the micro-mirrors 322 on or off. When the micro-mirrors 322 receive activated data, the number of reflected beams provided to the optical system 330 is substantially the same as the number of the micro-mirrors 322.

The optical system 330 includes a plurality of lenses. The optical system 330 transforms the reflected beams provided from the DMD 320 into a plurality of spot beams SB. The optical system 330 condenses the reflected beams emitted from the DMD 320 and increases the distance between the reflected beams.

The digital exposure device 400 irradiates the spot beams SB onto the substrate SUB disposed on the stage STA to expose the substrate SUB to light. The photoresist layer 30 in the light blocking region LBA formed on the base substrate 10 is not exposed to the light and the photoresist layer 30 in the exposing region LEA is exposed to the light.

Figure 7:
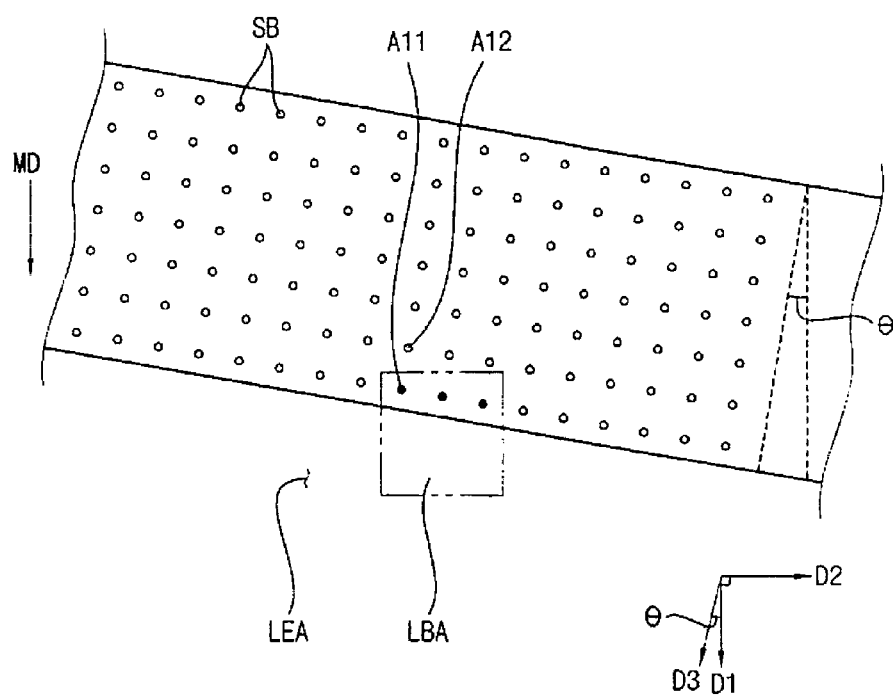
FIG. 7 is a plan view illustrating the exposure process using the digital exposure device in FIG. 6.

FIG. 7 is a plan view illustrating the exposure process using the digital exposure device in FIG. 6.

Referring to FIG. 7, with respect to a first direction D1 as a scanning direction MD, the DMD 320 is fixed to be inclined by a predetermined angle θ with respect to the substrate SUB in order to expose an area along a second direction D2 perpendicular to the first direction D1 to light. Thus, the substrate SUB and the DMD 320 are disposed to be inclined along a third direction D3. When the DMD 320 is fixed at a predetermined position, the substrate SUB moves along the scanning direction MD so that the spot beams SB overlap with each other to be provided to a region of the substrate SUB. The spot beams SB may be selectively provided to the substrate SUB according to a turning-on state or a turning-off state of the micro-mirrors 322.

The micro-mirrors 322 corresponding to the light-blocking region LBA receive inactivated data and the micro-mirrors 322 corresponding to the exposing region LEA receive activated data. When the micro-mirrors 322 receive the inactivated data, spot beams are not provided to the substrate SUB.

In addition, when the micro-mirrors 322 receive the activated data, the spot beams SB are provided to the substrate SUB. Hereinafter, a spot beam region corresponding to each of the micro-mirrors 322 when the micro-mirrors 322 receive inactivated data is expressed by "●," and refers to a "light-blocking point." In addition, a spot beam region corresponding to each of the micro-mirrors 322 when the micro-mirrors 322 receive the activated data is expressed by "○," and refers to an "exposed point."

When viewed in a plan of FIG. 7, the image data for the light-blocking region LBA having a rectangular shape is provided to the digital exposure device 400 so that the activated data and the inactivated data are provided to each of the micro-mirrors 322.

When the micro-mirror 322 is disposed in the light-blocking region LBA, the micro-mirror 322 receives the inactivated data to define the light-blocking point A11. The micro-mirror 322 disposed in the exposing region LEA receives the activated data to provide the spot beam SB to the substrate SUB, thereby defining the exposed point A12 in the substrate SUB. As the substrate SUB moves in the scanning direction MD, the micro-mirror 322 defining the exposed point A12 in the exposing region LEA of the prior process is disposed in the light-blocking region LBA. Thus, the micro-mirror 322 defining the exposed point A12 of the prior process receives the inactivated data in the light-blocking region LBA, thereby defining the light-blocking point of the substrate SUB.

The light-blocking region LBA may not receive the spot beams SB and the exposing region LEA may receive the spot beams SB through the above steps to expose the substrate SUB to light.

Figure 8:
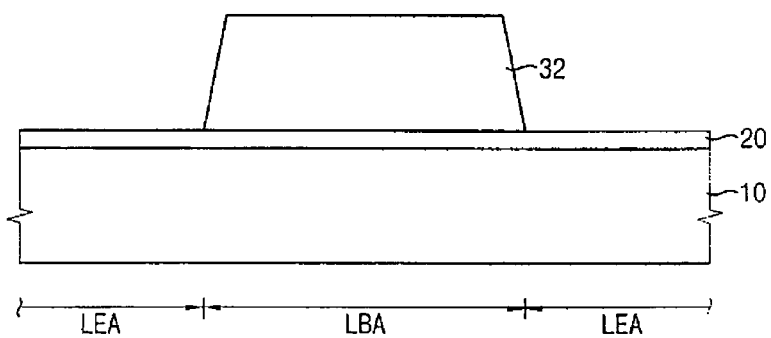
FIG. 8 and FIG. 9 are cross-sectional views illustrating a developing process and an etching process of the method of forming the pattern according to an exemplary embodiment of the present invention.
Figure 9:
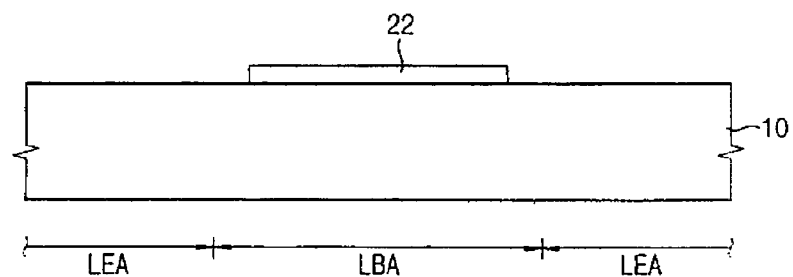

FIG. 8 and FIG. 9 are cross-sectional views illustrating a developing process and an etching process of the method of forming the pattern according to an exemplary embodiment of the present invention.

Referring to FIG. 8, the base substrate 10 including the photoresist layer 30 exposed to light using the digital exposure device 400 is dipped into a developing solution. Alternatively, the developing solution may be sprayed to the base substrate 10 on which the photoresist layer 30 is formed.

The developing solution may be an alkaline solution. In particular, although not limited, the developing solution may include alkaline hydroxide, ammonium hydroxide or tetramethyl ammonium hydroxide ("TMAH"), etc. The base substrate 10 is dipped into the developing solution so that the photoresist layer 30 in the exposing region LEA using the digital exposure device 400 may be dissolved in the developing solution. In contrast, the photoresist layer 30 in the light-blocking region LBA is not dissolved in the developing solution and remains on the base substrate 10. Thus, a photo pattern 32 is formed on the thin film 20.

The base substrate 10 on which the photo pattern 32 is formed is post-baked. An adherence between the photo pattern 32 and the thin film 20 and a chemical resistance may be improved by post-baking the base substrate 10. Post-baking the base substrate 10 may be performed at a temperature of less than a softening point of the photoresist layer 30, for example, in a range of about 100° C. to about 150° C.

Referring to FIG. 9, the thin film 20 is patterned using the photo pattern 32 as an etch stopping layer. The thin film 20 may be patterned by a wet etching method or a dry etching method. Thus, a thin film pattern 22 is formed under the photo pattern 32.

After forming the thin film pattern 22, the photo pattern 32 may be detached from the base substrate 10 using a stripping solution. Therefore, only the thin film pattern 22 remains on the base substrate 10.

According to the above descriptions, the photo pattern 32 is formed using the photoresist composition according to exemplary embodiments of the present invention, and the thin film pattern 22 is formed using the photo pattern 32. Here, the photo pattern 32 is formed using the digital exposure device 400 without an additional mask so that the manufacturing cost may be reduced. The photoresist composition has good photosensitivity for light having the wavelength of the h-line range, and has excellent resolution and thermal resistance so that the reliability of the photo pattern 32 may be improved. Moreover, the reliability of the thin film pattern 22 formed using the photo pattern 32 may be improved.

Figure 10:
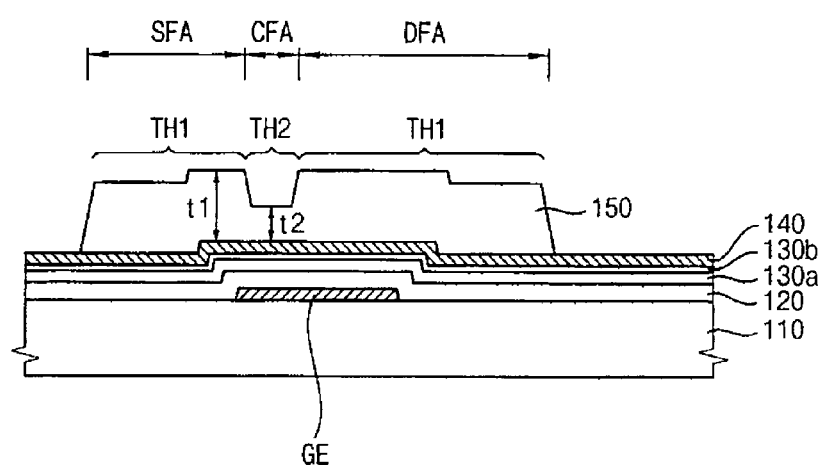
FIG. 10 to FIG. 12 are cross-sectional views illustrating a method of manufacturing a display substrate according to another exemplary embodiment of the present invention.
Figure 11:
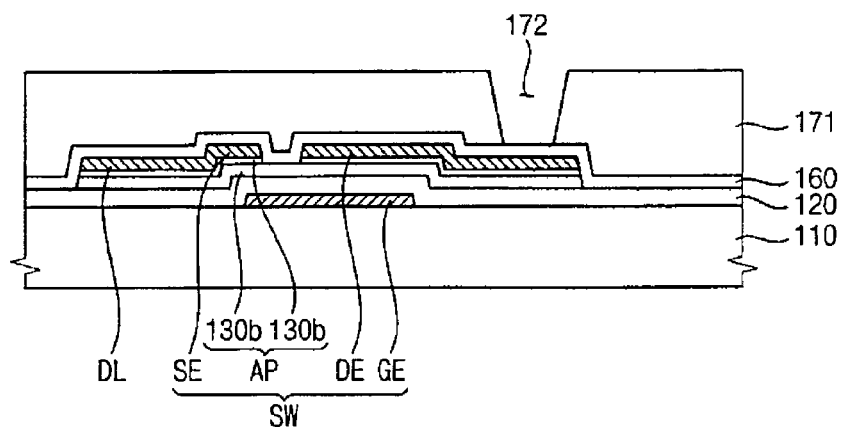
Figure 12:
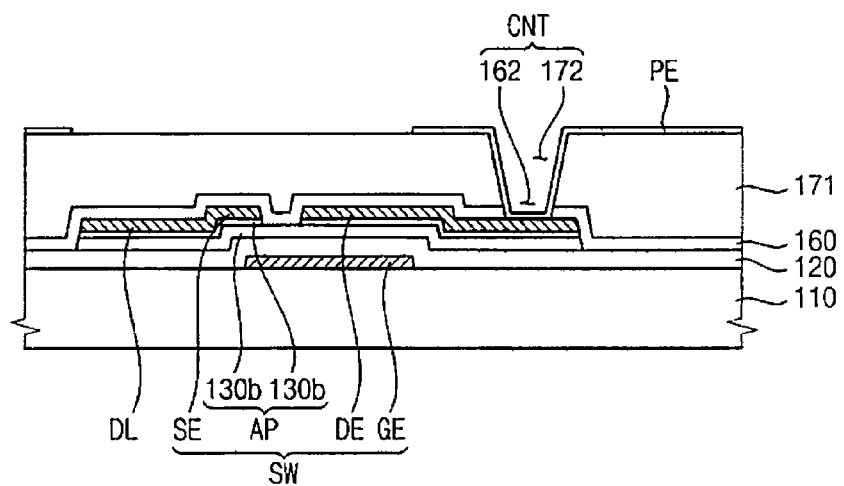

FIG. 10 to FIG. 12 are cross-sectional views illustrating a method of manufacturing a display substrate according to another exemplary embodiment of the present invention.

Referring to FIG. 10, a gate pattern including a gate electrode GE and a gate line (not shown) connected to the gate electrode GE is formed on a base substrate 110. A gate metal layer formed on the base substrate 110 is etched using a first photo pattern to form the gate pattern. The first photo pattern may be formed using the photoresist composition according to exemplary embodiments of the present invention via processes substantially the same as the exposure and developing processes illustrated above in FIG. 2 to FIG. 8. Thus, any repetitive descriptions for the photoresist composition, the exposure and developing processes will be omitted.

A gate insulating layer 120, a semiconductor layer 130a, an ohmic contact layer 130b and a source metal layer 140 are sequentially formed on the base substrate 110 on which the gate pattern is formed. The gate insulating layer 120 may include silicon nitride. The semiconductor layer 130a may include an amorphous silicon layer, and the ohmic contact layer 130b may include an amorphous silicon layer doped with n-type dopants at a high concentration.

A second photo pattern 150 is formed on the base substrate 110 on which the source metal layer 140 is formed. The second photo pattern 150 may include a first thickness portion TH1 formed in a first electrode-formed region SFA and a second electrode-formed region DFA spaced apart from each other, and a second thickness portion TH2 formed in a channel-formed region CFA. A first thickness t1 of the first thickness portion TH1 is greater than a second thickness t2 of the second thickness portion TH2.

The second photo pattern 150 may be formed using a photoresist composition according to exemplary embodiments of the present invention. Activated and inactivated data are provided to the micro-mirrors 322 of the digital exposure device 400 in FIG. 2 so that the first and second electrode-formed regions SFA and DFA are determined as a "light-blocking region." In addition, regions except for the first and second electrode-formed regions SFA and DFA, and the channel-formed region CFA is an "exposing region" by the activated and inactivated data.

The channel-formed region CFA serves as a "medium exposing region" and receives smaller amount of light than the exposing region such that the number of spot beams SB irradiated to the channel-formed region CFA is less than the number of spot beams SB irradiated to the exposing region.

Therefore, the photoresist layer in the first and second electrode-formed regions as the light-blocking region is not dissolved in the developing solution but remains to form the first thickness portion TH1. In addition, the photoresist layer in the channel-formed region CFA is partially dissolved in the developing solution to form the second thickness portion TH2 thinner than the first thickness portion TH1, and the photoresist layer in the regions excluding the first and second electrode-formed regions and the channel-formed region CFA is completely dissolved in the developing solution and is removed. Since the photoresist composition according to exemplary embodiments of the present invention has good photosensitivity, profiles of the first and second thickness portions TH1 and TH2 may be stable.

The source metal layer 140, the semiconductor layer 130a and the ohmic contact layer 130b are etched using the second photo pattern 150 as an etch stopping layer. First, the source metal layer 140, the semiconductor layer 130a and the ohmic contact layer 130b are etched using the second photo pattern 150, and then the second photo pattern 150 is etched to remove the second thickness portion TH2. Second, the second source metal layer 140 and the ohmic contact layer 130b are etched using the second photo pattern 150 remaining after the second thickness portion TH2 is removed.

Referring to FIG. 11, the source metal layer 140, the ohmic contact layer 130b and the semiconductor layer 130a are patterned to form a source electrode SE, an active pattern AP, a drain electrode DE and a data line DL connected to the source electrode SE. The source electrode SE, the active pattern AP, the drain electrode DE and the gate electrode GE define a switching element SW of a display substrate. A passivation layer 160 and an organic layer 171 are formed on the base substrate 110 on which the switching element SW is formed.

A first hole 172 is formed in a region of the organic layer 171 overlapping with the drain electrode DE. The passivation layer 160 is partially exposed through the first hole 172.

Referring to FIG. 12, the passivation layer 160 in the first hole 172 is removed using the organic layer 171 as an etch stopping layer, to form a second hole 162 in the passivation layer 160. The first and second holes 172 and 162 may define a contact hole CNT partially exposing the drain electrode DE.

A pixel electrode PE is formed on the base substrate 110 on which the contact hole CNT is formed. The pixel electrode PE directly makes contact with the drain electrode DE exposed through the contact hole CNT. In forming the pixel electrode PE, the photoresist composition according to exemplary embodiments of the present invention and the digital exposure device 400 may be used.

According to the above descriptions, a photoresist composition includes a multivalent phenol-based compound so that photosensitivity, thermal resistance and profile reliability may be improved without decreasing the residue rate and the resolution. Therefore, photo properties of the photoresist composition for a digital exposure device may be improved so that the reliability of manufacturing a pattern and a display substrate may be improved.

While the present invention has been described with reference to exemplary embodiments, it will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A photoresist composition comprising:
   an alkali-soluble resin;
   a quinone diazide-based compound;
   a multivalent phenol-based compound represented by Chemical Formula 1; and
   a solvent, wherein Chemical Formula 1 is represented by the following:

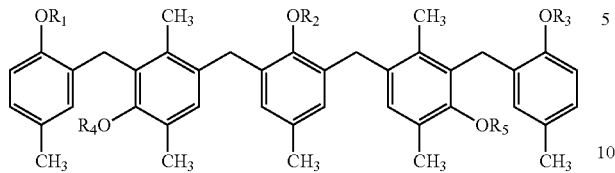

wherein $R_1$, $R_2$, $R_3$, $R_4$ and $R_5$ independently represent a hydrogen atom or a functional group represented by Chemical Formula 2, and wherein Chemical Formula 2 is represented by the following:

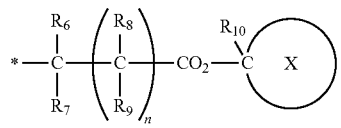

wherein $R_6$, $R_7$, $R_8$ and $R_9$ independently represent a hydrogen atom or an alkyl group having 1 to 4 carbon atoms, "n" represents an integer of 0 to 3, $R_{10}$ represents an alkyl group having 1 to 6 carbon atoms or a cycloalkyl group having 3 to 12 carbon atoms, and a ring X represents a cycloaliphatic hydrocarbon group having 3 to 20 carbon atoms.

2. The photoresist composition of claim 1, wherein an amount of the alkali-soluble resin is in a range of about 10% by weight to about 25% by weight, an amount of the quinone diazide-based compound is in a range of about 1% by weight to about 10% by weight, an amount of the multivalent phenol-based compound is in a range of about 0.5% by weight to about 10% by weight, and an amount of the solvent is a reminder of the photoresist composition, based on a total weight of the photoresist composition.

3. The photoresist composition of claim 1, wherein $R_6$ and $R_7$ independently represent a hydrogen atom and "n" represents 0.

4. The photoresist composition of claim 1, wherein an average molecular weight of the multivalent phenol-based compound is in a range of about 700 to about 5,000.

5. The photoresist composition of claim 1, further comprising at least one selected from the group consisting of 1,4-cyclohexanediol and 1,4-cyclohexanedimethanol.

6. The photoresist composition of claim 1, wherein the photoresist composition absorbs light having a wavelength in a range of about 392 nm to about 417 nm to prevent crosslinking of the alkali-soluble resin.

7. The photoresist composition of claim 1, wherein Chemical Formula 2 comprises Chemical Formula 3, wherein Chemical Formula 3 is represented by the following:

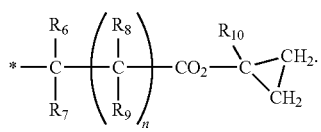

8. The photoresist composition of claim 1, wherein Chemical Formula 2 comprises Chemical Formula 4, wherein Chemical Formula 4 is represented by the following:

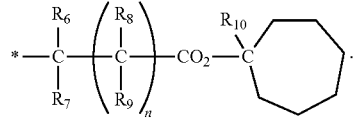

9. A method of forming a pattern, the method comprising:
forming a film on a substrate;
forming a photoresist layer using a photoresist composition on the film, the photoresist composition comprising an alkali-soluble resin, a quinone diazide-based compound, a multivalent phenol-based compound represented by Chemical Formula 1, and a solvent;
forming a photo pattern using the photoresist layer; and
etching the film using the photo pattern as an etch stopping layer to form a film pattern,
wherein Chemical Formula 1 is represented by the following:

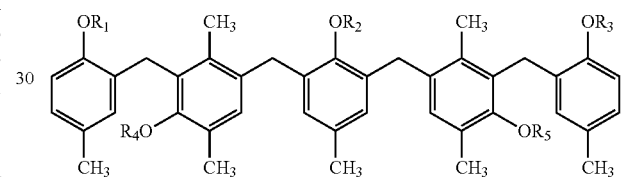

wherein $R_1$, $R_2$, $R_3$, $R_4$ and $R_5$ independently represent a hydrogen atom or a functional group represented by Chemical Formula 2;

wherein Chemical Formula 2 is represented by the following:

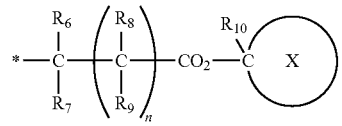

wherein $R_6$, $R_7$, $R_8$ and $R_9$ independently represent a hydrogen atom or an alkyl group having 1 to 4 carbon atoms, "n" represents an integer of 0 to 3, $R_{10}$ represents an alkyl group having 1 to 6 carbon atoms or a cycloalkyl group having 3 to 12 carbon atoms, and a ring X represents a cycloaliphatic hydrocarbon group having 3 to 20 carbon atoms.

10. The method of claim 9, wherein the photoresist composition comprises:
about 10% by weight to about 25% by weight of the alkali-soluble resin, about 1% by weight to about 10% by weight of quinone diazide-based compound, about 0.5% by weight to about 10% by weight of the multivalent phenol-based compound, and a reminder of the solvent, based on a total weight of the photoresist composition.

11. The method of claim 9, wherein an average molecular weight of the multivalent phenol-based compound is in a range of about 700 to about 5,000.

12. The method of claim 9, wherein forming the photo pattern comprises:
providing light having a wavelength in a range of about 392 nm to about 417 nm to the photoresist layer; and
developing the photoresist layer exposed by the light.

13. The method of claim 9, wherein forming the photo pattern comprises:
providing a plurality of spot beams to the photoresist layer using a digital exposure device.

14. The method of claim 13, wherein providing the plurality of spot beams comprises providing the spot beams overlapping with each other by micro-mirrors selectively turned on or off in the digital exposure device.

15. The method of claim 13, wherein the spot beams have a wavelength in a range of about 392 nm to about 417 nm.

16. A method of manufacturing a display substrate, the method comprising:
forming a metal layer on a substrate;
forming a photo pattern on the metal layer using a photoresist composition comprising an alkali-soluble resin, a quinone diazide-based compound, a multivalent phenol-based compound represented by Chemical Formula 1, and a solvent;
etching the metal layer using the photo pattern as an etch stopping layer to form a signal line and an electrode of a switching element connected to the signal line; and
forming a pixel electrode connected to the switching element,
wherein Chemical Formula 1 is represented by the following:

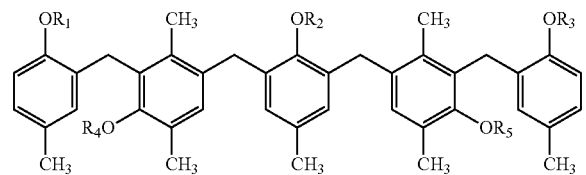

wherein $R_1$, $R_2$, $R_3$, $R_4$ and $R_5$ independently represent a hydrogen atom or a functional group represented by Chemical Formula 2;
wherein Chemical Formula 2 is represented by the following:

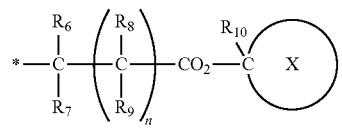

wherein $R_6$, $R_7$, $R_8$ and $R_9$ independently represent a hydrogen atom or an alkyl group having 1 to 4 carbon atoms, "n" represents an integer of 0 to 3, $R_{10}$ represents an alkyl group having 1 to 6 carbon atoms or a cycloalkyl group having 3 to 12 carbon atoms, and a ring X represents a cycloaliphatic hydrocarbon group having 3 to 20 carbon atoms.

17. The method of claim 16, wherein the photoresist composition comprises:
about 10% by weight to about 25% by weight of the alkali-soluble resin, about 1% by weight to about 10% by weight of quinone diazide-based compound, about 0.5% by weight to about 10% by weight of the multivalent phenol-based compound, and a reminder of the solvent, based on a total weight of the photoresist composition.

18. The method of claim 16, wherein an average molecular weight of the multivalent phenol-based compound is in a range of about 700 to about 5,000.

19. The method of claim 16, wherein forming the photo pattern comprises:
providing light having a wavelength in a range of about 392 nm to about 417 nm to a photoresist layer; and
developing the photoresist layer exposed by the light.

20. The method of claim 16, wherein forming the photo pattern comprises:
providing a plurality of spot beams to a photoresist layer using a digital exposure device,
wherein the spot beams overlap with each other by micro-mirrors being selectively turned on or off in the digital exposure device.

21. The method of claim 16, wherein the signal line is a gate line configured to apply a gate driving signal and the electrode is a gate electrode connected to the gate line,
further comprising: forming a data line crossing the gate line, a source electrode connected to the data line and a drain electrode spaced apart from the source electrode using the photoresist composition.

22. The method of claim 16, wherein the signal line is a data line configured to apply a data driving signal and the electrode comprises a source electrode connected to the data line and a drain electrode spaced apart from the source electrode,
further comprising: forming a gate line crossing the data line and a gate electrode connected to the gate line using the photoresist composition.

* * * * *